United States Patent
Kakumoto et al.

(10) Patent No.: US 7,053,943 B2
(45) Date of Patent: May 30, 2006

(54) SCANNING CIRCUIT, AND IMAGING APPARATUS HAVING THE SAME

(75) Inventors: Tomokazu Kakumoto, Nagaokakyo (JP); Yoshio Hagihara, Yokohama (JP)

(73) Assignee: Minolta Co., Ltd., Osaka (JP)

( * ) Notice: Subject to any disclaimer, the term of this patent is extended or adjusted under 35 U.S.C. 154(b) by 548 days.

(21) Appl. No.: 09/988,528

(22) Filed: Nov. 20, 2001

(65) Prior Publication Data

US 2002/0093497 A1    Jul. 18, 2002

(30) Foreign Application Priority Data

Nov. 21, 2000  (JP) ............................. 2000-353920

(51) Int. Cl.
*H04N 5/225*    (2006.01)

(52) U.S. Cl. ...................... 348/260; 345/100
(58) Field of Classification Search ................ 348/260, 348/264, 204, 312; 345/98, 100, 99; 358/410, 358/412, 486
See application file for complete search history.

(56) References Cited

U.S. PATENT DOCUMENTS

| | | | | | |
|---|---|---|---|---|---|
| 5,200,925 | A | * | 4/1993 | Morooka | 365/219 |
| 5,818,413 | A | * | 10/1998 | Hayashi et al. | 345/100 |
| 6,166,769 | A | * | 12/2000 | Yonemoto et al. | 348/308 |
| 6,396,468 | B1 | * | 5/2002 | Matsushima et al. | 345/87 |
| 6,512,545 | B1 | * | 1/2003 | Mizoguchi et al. | 348/304 |
| 6,590,611 | B1 | * | 7/2003 | Ishida et al. | 348/310 |

FOREIGN PATENT DOCUMENTS

| | | |
|---|---|---|
| JP | 2000-206491 | 7/2000 |
| JP | 2001-069406 | 3/2001 |

* cited by examiner

*Primary Examiner*—David Ometz
*Assistant Examiner*—Hung H. Lam
(74) *Attorney, Agent, or Firm*—Buchanan Ingersoll PC

(57) ABSTRACT

A scanning circuit operates at a driving speed approximately twice the conventional speed when clock signals having the same frequency as those in the prior art are supplied. By alternately driving the switches in even-numbered and odd-numbered transfer stages T1 to Tn, the input side and the output side of each transfer stage are simultaneously made high in order of T1, T2, . . . and Tn. Logical AND circuits are connected to the even- and odd-numbered stages to output pulse signals for scanning at intervals shorter than the clock period.

15 Claims, 5 Drawing Sheets

SCANNING CIRCUIT, AND IMAGING APPARATUS HAVING THE SAME

RELATED APPLICATION

This application is based on application Ser. No. 2000-353920 filed in Japan, the entire content of which is hereby incorporated by reference.

BACKGROUND OF THE INVENTION

1. Field of the Invention

The present invention relates to a scanning circuit used in imaging devices and image display devices, and more particularly, to a scanning circuit suitable for high-speed operation.

2. Description of the Related Art

The schematic circuit diagram of FIG. 10 shows the internal structure of a conventional scanning circuit used in imaging devices and image display devices. The scanning circuit shown in FIG. 10 has a number, n, of transfer stages (ta1 to tan) that generate a sequence of pulses. The transfer stages each comprise two switches and two inverters. That is, the k-th (k is a natural number where $1 \leq k \leq n$) transfer stage tak comprises: a switch ska one end of which is supplied with an output from the transfer stage ta(k−1); an inverter ika the input side of which is connected to the other end of the switch ska; a switch skb one end of which is connected to the output side of the inverter ika; and an inverter ikb the input side of which is connected to the other end of the switch skb (FIG. 10 shows the first to the third stages). The output from the inverter ikb is the output outk of the transfer stage tak. For example, when the scanning circuit of FIG. 10 is used with a solid-state image sensing device in an imaging apparatus, the output outk is output as a signal for scanning the solid-state image sensing device.

To the scanning circuit of FIG. 10, clock signals Xa and Xb for alternately operating the switches provided in each transfer stage are supplied with phases that are shifted relative to one another. In the k-th transfer stage tak, when the clock signal Xa is high, the switch ska is on, and when the clock signal Xb is high, the switch skb is on.

Therefore, in a case where the output out(k−1) of the transfer stage ta(k−1) is output as a high-level pulse signal, when the clock pulse Xa is supplied to turn on the switch ska, a high-level signal is input to the inverter ika via the switch ska and a low-level signal is output from the inverter ika. Then, when the switch ska is turned off and the clock pulse Xb is supplied to turn on the switch skb, a low-level signal is input to the inverter ikb via the switch skb and a high-level signal is output from the inverter ikb as an output outk of the transfer stage tak. At this time, the output out(k−1) of the transfer stage ta(k−1) becomes low.

Then, when the clock pulse Xa is again supplied to turn on the switch ska, the low-level signal is input to the inverter ika via the switch ska and a high-level signal is output from the inverter ika. Then, when the clock pulse Xb is supplied to turn on the switch skb, the high-level signal is input to the inverter ikb via the switch skb and a low-level signal is output from the inverter ikb as the output outk of the transfer stage tak.

Assume now that a start pulse that is high is supplied to the switch s1a of the transfer stage ta1 while the clock signal Xb is low, and the clock pulse Xa is supplied while the start pulse is high, as shown in FIG. 11. At this time, the switches s1a to sna are turned on by the clock pulse Xa. Moreover, the output of the inverter i1a becomes low and the outputs of the inverters i2a to ina become high.

Then, when the start pulse is driven low and the clock pulse Xb is supplied, the switches s1b to snb are turned on. At this time, the output of the inverter i1b becomes high and the outputs of the inverters i2b to inb become low. Consequently, as shown in FIG. 11, the output out1 of the transfer stage ta1 becomes high and the outputs out2 to outn of the transfer stages ta2 to tan become low.

Then, when the clock pulse Xa is supplied again, the switches s1a to sna are turned on, the output of the inverter i2a becomes low and the outputs of the inverters i1a and i3a to ina become high. Then, when the clock pulse Xb is supplied, the switches s1b to snb are turned on, the output of the inverter i2b becomes high and the outputs of the inverters i1b and i3b to inb become low. Consequently, as shown in FIG. 11, the output out2 of the transfer stage ta2 becomes high and the outputs out1 and out3 to outn of the transfer stages ta1 and ta3 to tan become low.

Thus, by alternately supplying the high-level clock pulses Xa and Xb, as shown in FIG. 11, the outputs out1 to outn of the number, n, of transfer stages ta1 to tan are output in order of out1, out2, out3, . . . as high-level pulse signals for scanning. The width (pulse width) of the output waveform of the output outk is the same as the length of one period of the clock signals Xa and Xb.

In the conventional scanning circuit that outputs a signal for scanning in this manner, since the clock pulses Xa and Xb are alternately supplied so as not to overlap each other, it is necessary that the pulse width of one clock be less than half the pulse width of the output outk. On the other hand, there is an upper limit to the frequency of the externally input clock signals Xa and Xb. Therefore, the pulse width of the output outk from the scanning circuit can be reduced only to a width corresponding to the limit of the frequency of the clock signals Xa and Xb. Consequently, the driving speed of the driving circuit of an imaging device or an image display device having such a scanning circuit is limited by the scanning circuit, so that a sufficient driving speed cannot be achieved.

SUMMARY OF THE INVENTION

In view of this problem, an object of the present invention is to provide a scanning circuit suitable for operating at a higher speed than the conventional scanning circuit when clock signals having the same frequency as those in the prior art are supplied.

To attain the above-mentioned object, according to an aspect of the present invention, a scanning circuit comprises: a number, n (n is an integer not less than 2), of transfer stages connected in series; and an output circuit that outputs, as a k-th-stage (k is a natural number where $1 \leq k \leq n$) pulse signal for scanning, a signal generated by an AND function of an input to a k-th transfer stage and an output from the k-th transfer stage. By alternately driving odd-numbered and even-numbered ones of the number, n, of transfer stages, the number, n, of pulse signals for scanning are output one by one from the output circuit.

In this scanning circuit, when the odd-numbered transfer stages are driven in a case where a start pulse which is high is supplied to the first transfer stage, a high-level signal is output from the first transfer stage. At this time, when the output circuit comprises a number, n, of logic gates that calculate the AND functions of the inputs and the outputs of the transfer stages, the first-stage pulse signal for scanning is output from the logic gate supplied with the start pulse which is high and the high-level signal from the first transfer stage.

Then, when the even-numbered transfer stages are driven next, a high-level signal is output from the second transfer stage supplied with the high-level signal from the first transfer stage. At this time, the second-stage pulse signal for scanning is output from the logic gate supplied with the high-level signals from the first and the second transfer stages. As described above, by alternately driving the odd-numbered and the even-numbered transfer stages, the third-, the fourth-, . . . and the n-th-stage pulses for scanning are successively output from the output circuit.

According to another aspect of the present invention, a scanning circuit comprises: a number, n (n is an integer not less than 2), of transfer stages connected in series; and an output circuit supplied with a first pulse and a second pulse whose phases are opposite to each other, said output circuit comprising: a first logic gate circuit that obtains an AND function of an output of an odd-numbered one of the number, n, of transfer stages and the first pulse; and a second logic gate circuit that obtains an AND function of an output of an even-numbered one of the number, n, of transfer stages and the second pulse. By alternately driving odd-numbered and even-numbered ones of the number, n, of transfer stages and alternately driving the first and the second logic gate circuits of the output circuit by the first and the second pulses, first- to n-th-stage pulse signals for scanning are output one by one from the output circuit.

In this scanning circuit, when the odd-numbered transfer stages are driven in a case where a start pulse which is high is supplied to the first transfer stage, a high-level signal is output from the first transfer stage. At this time, when the first logic gate circuit comprises a plurality of logic gates that calculate the AND functions of the inputs of the transfer stages and the first pulse, the first pulse is supplied simultaneously with the driving of the odd-numbered transfer stages, and the first-stage pulse signal for scanning is output from the logic gate supplied with the first pulse and the high-level signal from the first transfer stage.

Then, when the even-numbered transfer stages are driven next, a high-level signal is output from the second transfer stage supplied with the high-level signal from the first transfer stage. At this time, when the second logic gate circuit comprises a plurality of logic gates that calculate the AND functions of the inputs of the transfer stages and the second pulse, the second pulse is supplied simultaneously with the driving of the even-numbered transfer stages, and the second-stage pulse signal for scanning is output from the logic gate supplied with the second pulse and the high-level signal from the second transfer stage. As described above, by alternately driving the odd-numbered and the even-numbered transfer stages and supplying the output circuit with the first and the second pulses whose phases are opposite to each other, the third-, the fourth-, . . . and the n-th-stage pulses for scanning are successively output from the output circuit.

Moreover, in this scanning circuit, after driving of the odd-numbered ones of the number, n, of transfer stages is started, driving of the first logic gate circuit is started, and after driving of the even-numbered ones of the number, n, of the transfer stages is started, driving of the second logic gate circuit is started.

Further, in the above-described scanning circuit, the transfer stages each comprise: a switch one end of which is supplied with an output of a preceding transfer stage; and a buffer an input side of which is connected to the other end of the switch and an output side of which is connected to a switch of a succeeding transfer stage.

According to still another aspect of the present invention, a scanning circuit comprises: a number, x (x is an integer not less than 2), of first transfer stages to which a first clock and a second clock are input at different times and that performs a transfer operation so that a signal supplied to an input side when the second clock is input after the first clock is input is output to an output side; a number, y (y is x−1 or x), of second transfer stages to which the first clock and the second clock are input at different times and that perform a transfer operation so that a signal supplied to an input side when the first clock is input after the second clock is input is output to an output side; and an output circuit that outputs, as a (2a−1)-th-stage (a is a natural number where $1 \leq a \leq y$) pulse signal for scanning, a signal generated by an AND function of an output of an a-th first transfer stage and an output of an a-th second transfer stage, and outputs, as a 2b-th-stage (b is a natural number where 1 b x−1) pulse signal for scanning, a signal generated by an AND function of an output of a (b+1)-th first transfer stage and an output of a b-th second transfer stage, and (x+y−1)-th-stage pulse signals for scanning are output one by one from the output circuit.

In this scanning circuit, when the first clock and the second clock are successively input in a case where a start pulse which is high is supplied to the initial first and second transfer stages, a high-level signal is output from the initial first transfer stage. Then, when the first clock is input again, a high-level signal is output from the initial second transfer stage. At this time, when the output circuit comprises a plurality of logic gates that calculate the AND functions of the outputs of the first transfer stages and the outputs of the second transfer stages, a first-stage pulse signal for scanning is output from the logic gate supplied with the high-level signals from the initial first and second transfer stages.

Then, when the second clock is input again, a high-level signal is output from the next first transfer stage. At this time, a second-stage pulse signal for scanning is output from the logic gate supplied with the high-level signal from the initial second transfer stage and the high-level signal from the next first transfer stage. As described above, by alternately inputting the first and the second clocks to the first and the second transfer stages, the third-, the fourth-, . . . and the n-th-stage pulses for scanning are successively output from the output circuit.

In the above-described scanning circuit, the first transfer stages each comprise: a first switch one end of which is supplied with an output of a preceding first transfer stage and that is turned on by the first clock; a first inverter an input side of which is connected to the other end of the first switch; a second switch one end of which is connected to an output side of the first inverter and that is turned on by the second clock; and a second inverter an input side of which is connected to the other end of the second switch and an output side of which is connected to the first switch of a succeeding first transfer stage. The second transfer stages each comprise: a third switch one end of which is supplied with an output of a preceding second transfer stage and that is turned on by the second clock; a third inverter an input side of which is connected to the other end of the third switch; a fourth switch one end of which is connected to an output side of the third inverter and that is turned on by the first clock; and a fourth inverter an input side of which is connected to the other end of the fourth switch and an output side of which is connected to the third switch of a succeeding second transfer stage.

Further, the object of the present invention is attained by pulse signal generating means comprising:

a transfer stage portion comprising a plurality of transfer stages connected in series, said transfer stages each including at least one switch for passing current in a direction in which the transfer stages are connected in series;

a first pulse generating portion that supplies a first driving pulse to the first switches in the transfer stage portion at predetermined intervals;

a second pulse generating portion that supplies a second driving pulse whose phase is shifted from that of the first driving pulse, at the predetermined intervals, to second switches of the transfer stages which switches are not included in the first switches; and an output portion that outputs pulse signals successively from a plurality of gates connected to the transfer stages at intervals shorter than the predetermined intervals.

In the above-described means, the gates comprise: first gates capable of outputting pulse signals by being supplied with the first driving pulse; and second gates capable of outputting pulse signals by being supplied with the second driving pulse, and a pulse signal for scanning an output alternately from a gate included in the first gates and a gate included in the second gates.

Moreover, the object of the present invention is attained by pulse signal generating means comprising:

a transfer stage portion comprising a plurality of transfer stages connected in series, said transfer stages each including at least one switch for passing current in a direction in which the transfer stages are connected in series, said switches each being assigned to one of a plurality of groups;

a plurality of clock generating portions each corresponding to one of the groups, said clock generating portions supplying driving pulses having predetermined periods whose phases are shifted from one another, to the switches assigned to the groups to which the clock generating portions correspond, and an output portion that outputs pulse signals from the gates connected to the transfer stages, said transfer stage portion being structured so as to output pulse signals successively from the gates at intervals shorter than the predetermined periods of the driving pulse.

Moreover, an imaging apparatus is structured by use of the above-described scanning circuit. In that case, the scanning circuit is used as a circuit for main scanning (horizontal circuit). In this imaging apparatus, by using the above-described scanning circuit as the horizontal scanning circuit, the horizontal scanning circuit requiring high-speed driving can be sufficiently operated with clocks of a low frequency.

The invention itself, together with further objects and attendant advantages, will best be understood by reference to the following detailed description taken in conjunction with the accompanying drawings.

BRIEF DESCRIPTION OF THE DRAWINGS

In the following description, like parts are designated by like reference numbers throughout the several drawing.

DESCRIPTION OF THE PREFERRED EMBODIMENT

Different embodiments of the present invention will be described.

First Embodiment

Figure 1:
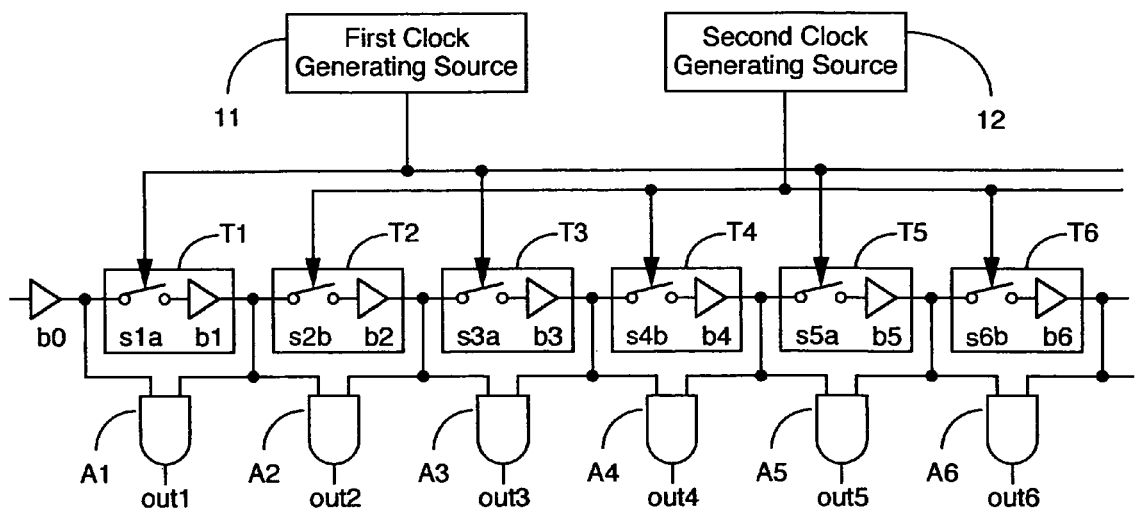
FIG. 1 is a schematic circuit diagram showing the internal structure of a scanning circuit of a first embodiment.
Figure 2:
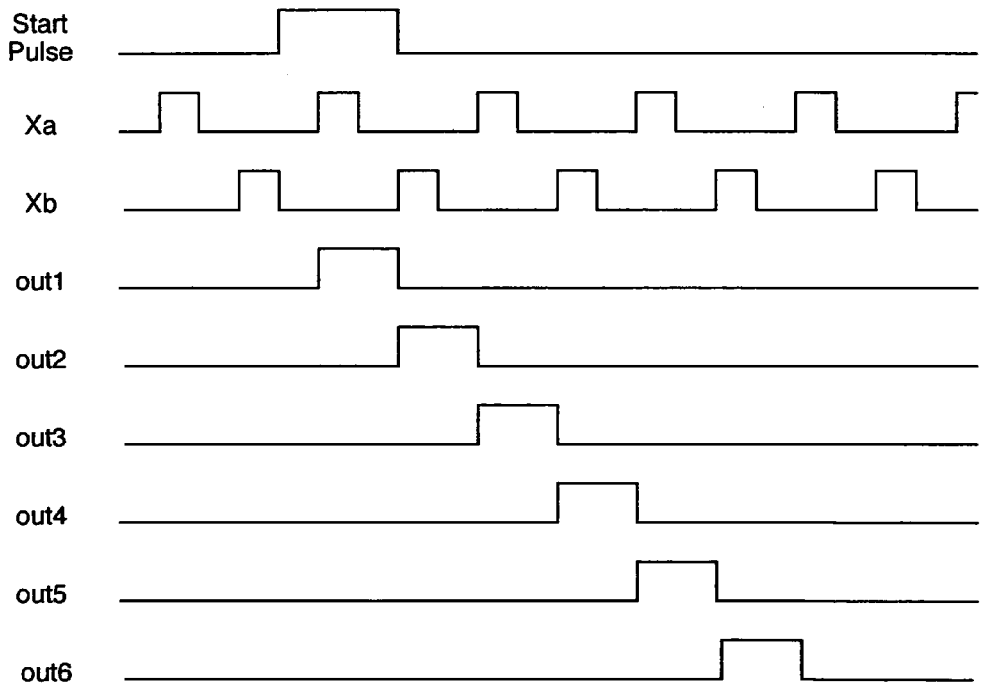
FIG. 2 is a timing chart showing the operation of the scanning circuit of the first embodiment.

A first embodiment of the present invention will be described with reference to the drawings. FIG. 1 is a schematic circuit diagram showing the internal structure of a scanning circuit of the present embodiment. FIG. 2 is a timing chart showing the operation of the scanning circuit of the present embodiment.

The scanning circuit of FIG. 1 comprises: a buffer b0 the input side of which is supplied with a start pulse; a number, n (where n is an integer not less than 2), of transfer stages T1 to Tn connected in series; and a number, n, of AND circuits A1 to An supplied with signals input to and output from the transfer stages T1 to Tn (the first to the sixth stages are shown in FIG. 1). The transfer stages T1 to Tn each comprise one switch and one buffer. That is, the k-th (k is a natural number where $1 \leq k \leq n$) transfer stage Tk comprises: a switch skx (x represents either a or b), one end of which is supplied with the output from the transfer stage T(k−1); and a buffer bk the input side of which is connected to the other end of the switch skx. The input end of the switch skx and the output side of the buffer bk are connected to the input terminals of the AND circuit Ak. The output outk of the AND circuit Ak is used as a signal for scanning.

The switches ska provided in the odd-numbered ones of the transfer stages T1 to Tn are switched by a clock signal Xa generated by a first clock generating source 11. The switches skb provided in the even-numbered ones of the transfer stages T1 to Tn are switched by a clock signal Xb generated by a second clock generating source 12. Therefore, when the clock signal Xa is high, the switches s1a, s3a, s5a, . . . of the transfer stages T1, T3, T5, . . . are on (closed), and when the clock signal Xb is high, the switches s2b, s4b, s6b, . . . of the transfer stages T2, T4, T6, . . . are on. The first clock generating source 11 and the second clock generating source 12 alternately generate clock pulses Xa and Xb as shown in FIG. 2.

In the scanning circuit structured as described above, a start pulse that is high is supplied to the first transfer stage T1 via the buffer b0, while the clock signal Xb is low as shown in FIG. 2. Then, when the clock pulse Xa is supplied while the start pulse is high, the switches s1a, s3a, s5a, of the odd-numbered transfer stages T1, T3, T5, are turned on. Consequently, since the state is such that a high-level signal is input only to the buffer b1 of the transfer stage T1 supplied with the start pulse via the buffer b0, a high-level signal is output via the switch s1a and the buffer b1 of the transfer stage T1.

At this time, since the signal input to the transfer stage T1 is high and the signal output from the transfer stage T1 is high, the two inputs to the AND circuit A1 are high, so that the output out1 from the AND circuit A1 is high. Then, after the switches s1a, s3a, s5a, . . . are turned off, the start pulse becomes low, when the clock pulse Xb is supplied, and one of the inputs to the AND circuit A1 becomes low, so that the output out1 becomes low.

Moreover, at this time, the switches s2b, s4b, s6b, . . . of the even-numbered transfer stages T2, T4, T6, . . . are turned on. Consequently, since the current state is such that a high-level signal is supplied only to the buffer b2 of the transfer stage T2 connected to the transfer stage T1, a high-level signal is output via the switch s2b and the buffer b2 of the transfer stage T2. At this time, since the signal input to the transfer stage T2 is high and the signal output from the transfer stage T2 is high, the two inputs to the AND circuit A2 are high, so that the output out2 from the AND circuit A2 is high.

Then, when the clock pulse Xa is supplied again after the switches s2b, s4b, s6, . . . are turned off, the switches s1a, s3a, s5a, . . . of the odd-numbered transfer stages T1, T3, T5, . . . are turned on, so that a low-level signal is input to the odd-numbered transfer stages other than the transfer stage T3 supplied with a high-level signal from the transfer stage T2. At this time, since a low-level signal is input also to the transfer stage T1, a low-level signal output via the switch s1a and the buffer b1 of the transfer stage T1 is input to the AND circuit A2, so that the output out2 becomes low.

Moreover, the transfer stage T3 performs an operation similar to that performed by the transfer stage T1 when the start pulse is supplied and the clock pulse Xa is supplied. Consequently, the signal input to the transfer stage T3 is high and the signal output from the transfer stage T3 is high, so that the output out3 from the AND circuit A3 is high.

Then, when the clock pulse Xb is supplied again after the switches s1a, s3a, s5a, . . . are turned off, the transfer stage T2 performs an operation similar to that performed by the transfer stage T1 when the clock pulse Xa is supplied and the output out3 is output, so that the signal output from the transfer stage T2 becomes low. Moreover, since the transfer stage T4 performs an operation similar to that performed by the transfer stage T2 when the clock pulse Xb is supplied and the output out2 is output, the signal input to the transfer stage T4 is high and the signal output from the transfer stage T4 is high, so that the output out4 from the AND circuit A4 is high.

By alternately supplying the clock pulses Xa and Xb to thereby alternately drive the odd-numbered transfer stages T1, T3, T5, . . . and the even-numbered transfer stages T2, T4, T6, . . . as described above, the outputs out1 to outn can be output from the AND circuits A1 to An in order of out1, out2, out3, . . . and outn as pulse signals for scanning.

By doing this, the pulse width of the clock pulses Xa and Xb externally input to the scanning circuit can be less than the full length of the pulse width of the output outk and can be twice that in the prior art. Consequently, pulse signals for high-speed scanning can be output from the scanning circuit with clocks having a lower frequency than those in the prior art.

Second Embodiment

Figure 3:
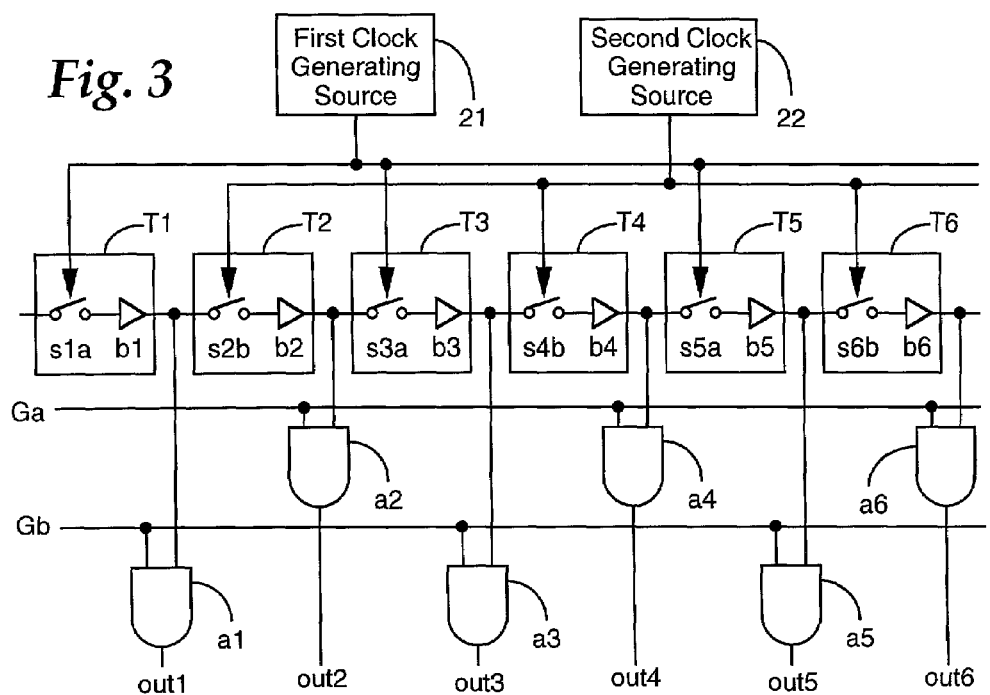
FIG. 3 is a schematic circuit diagram showing the internal structure of a scanning circuit of a second embodiment.
Figure 4:
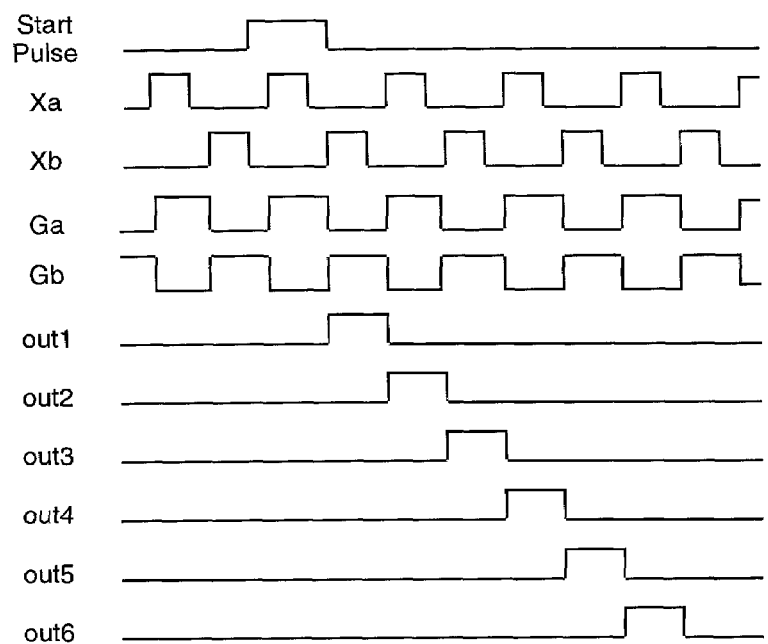
FIG. 4 is a timing chart showing the operation of the scanning circuit of the second embodiment.

A second embodiment of the present invention will be described with reference to the drawings. FIG. 3 is a schematic circuit diagram showing the internal structure of a scanning circuit of the present embodiment. FIG. 4 is a timing chart showing the operation of the scanning circuit of the present embodiment. In the scanning circuit of FIG. 3, the same parts as those of the scanning circuit of FIG. 1 are denoted by the same reference numbers, and detailed descriptions thereof are omitted.

The scanning circuit of FIG. 3 comprises: a number, n (n is an integer not less than 2), of transfer stages T1 to Tn connected in series; and a number, n, of AND circuits a1 to an supplied with signals output from the transfer stages T1 to Tn. Each transfer stage Tk comprises, as in the first embodiment (FIG. 1), a switch skx and a buffer bk (the first to the sixth stages are shown in FIG. 3).

The switches ska provided in the odd-numbered ones of the transfer stages T1 to Tn are switched by a clock signal Xa generated by a first clock generating source 21. The switches skb provided in the even-numbered ones of the transfer stages T1 to Tn are switched by a clock signal Xb generated by a second clock generating source 22. Therefore, when the clock signal Xa is high, the switches s1a, s3a, s5a, . . . of the transfer stages T1, T3, T5, . . . are on, and when the clock signal Xb is high, the switches s2b, s4b, s6b, . . . of the transfer stages T2, T4, T6, . . . are on. The first clock generating source 21 and the second clock generating source 22 alternately generate clock pulses Xa and Xb as shown in FIG. 4.

Moreover, a gate pulse Gb is supplied to one input of the odd-numbered AND circuits a1 to an, the other inputs of which are supplied with signals output from the odd-numbered transfer stages. A gate pulse Ga is supplied to one input of the even-numbered AND circuits, the other inputs of which are supplied with signals output from the even-numbered transfer stages. The gate pulses Ga and Gb are supplied so that the phases thereof are opposite to each other, and the pulse width thereof is substantially the same as the pulse width of the output outk.

In the scanning circuit structured as described above, a start pulse that is high is supplied to the first transfer stage T1 while the clock signal Xb is low as shown in FIG. 4. Then, while the start pulse is high, the clock pulse Xa is supplied and the gate pulse Ga is supplied. At this time, the switches s1a, s3a, s5a, . . . of the odd-numbered transfer stages T1, T3, T5, . . . are turned on by the clock pulse Xa. Consequently, since the state is such that a high-level signal is input only to the buffer b1 of the transfer stage T1 supplied with the start pulse, a high-level signal is output via the switch s1a and the buffer b1 of the transfer stage T1.

Moreover, since the gate pulse Ga which is high is supplied to the AND circuits a2, a4, a6, . . . , the outputs from the even-numbered transfer stages T2, T4, T6, . . . appear as the outputs out2, out4, out6, . . . of the AND circuits a2, a4, a6, . . . However, since a signal which is high is output only from the transfer stage T1 supplied with the start pulse, the outputs out2, out4, out6, . . . of the AND circuits a2, a4, a6, . . . are low.

Moreover, since the gate pulse Gb input to the AND circuits a1, a3, a5, . . . are low, the outputs out1, out3, out5, . . . of the AND circuits a1, a3, a5, . . . are low. The high-level signal output from the transfer stage T1 is held until the next clock pulse Xa is supplied after the start pulse becomes low.

Then, when the start pulse and the gate pulse Ga become low and the clock pulse Xb and the gate pulse Gb are supplied, the outputs out2, out4, out6, . . . of the AND circuits a2, a4, a6, . . . supplied with the gate pulse Ga become low. At this time, the switches s2b, s4b, s6b, . . . of the even-numbered transfer stages T2, T4, T6, . . . are turned on by the clock pulse Xb. Consequently, since the state is such that a high-level signal is input only to the buffer b2 of the transfer stage T2 supplied with a high-level signal from the transfer stage T1, a high-level signal is output via the switch s2b and the buffer b2 of the transfer stage T2.

Moreover, since the gate pulse Gb which is high is supplied to the AND circuits a1, a3, a5, . . . , the outputs from the odd-numbered transfer stages T1, T3, T5, . . . appear as the outputs out1, out3, out5, . . . of the AND circuits a1, a3, a5, . . . , Consequently, since a high-level signal is held in the transfer stage T1, only the output out1 of the AND circuit a1 is high. The output out1 of the AND circuit a1 is high while the gate pulse Gb is high. Moreover, the high-level signal output from the transfer stage T2 is held until the next clock pulse Xb is supplied.

Then, when the gate pulse Gb becomes low and the clock pulse Xa and the gate pulse Ga are supplied again, the outputs out1, out3, out5, . . . of the AND circuits a1, a3, a5, . . . supplied with the gate pulse Gb become low. At this time, since the switches s1b, s3b, s5b, . . . of the transfer stages T1, T3, T5, . . . are turned on by the clock pulse Xa, a high-level signal is output only from the transfer stage T3 supplied with a high-level signal from the transfer stage T2. Moreover, since a high-level signal is held in the transfer stage T2, only the output out2 is high that is from the AND gate a2 supplied with a high-level signal from the transfer stage T2 and the gate pulse Ga which is high.

By alternately supplying the clock pulses Xa and Xb to thereby alternately drive the odd-numbered transfer stages T1, T3, T5, . . . and the even-numbered transfer stages T2, T4, T6, . . . and alternately supplying the gate pulses Gb and Ga to thereby alternately drive the AND circuits a1, a3, a5, . . . and the AND circuits a2, a4, a6, . . . as described above, the outputs out1 to outn can be output from the AND circuits a1 to an in order of out1, out2, out3, . . . and outn as pulse signals for scanning.

By doing this, the pulse width of the clock pulses Xa and Xb externally input to the scanning circuit can be less than the full length of the pulse width of the output outk and can be twice that in the prior art. Consequently, pulse signals for high-speed scanning can be output from the scanning circuit with clocks having a lower frequency than those in the prior art. Moreover, the pulse width of the output outk depends on the pulse width of the gate pulses Ga and Gb.

Consequently, the pulse width of the pulse signals for scanning can be set by adjusting the pulse width of the gate pulses.

Third Embodiment

Figure 5:
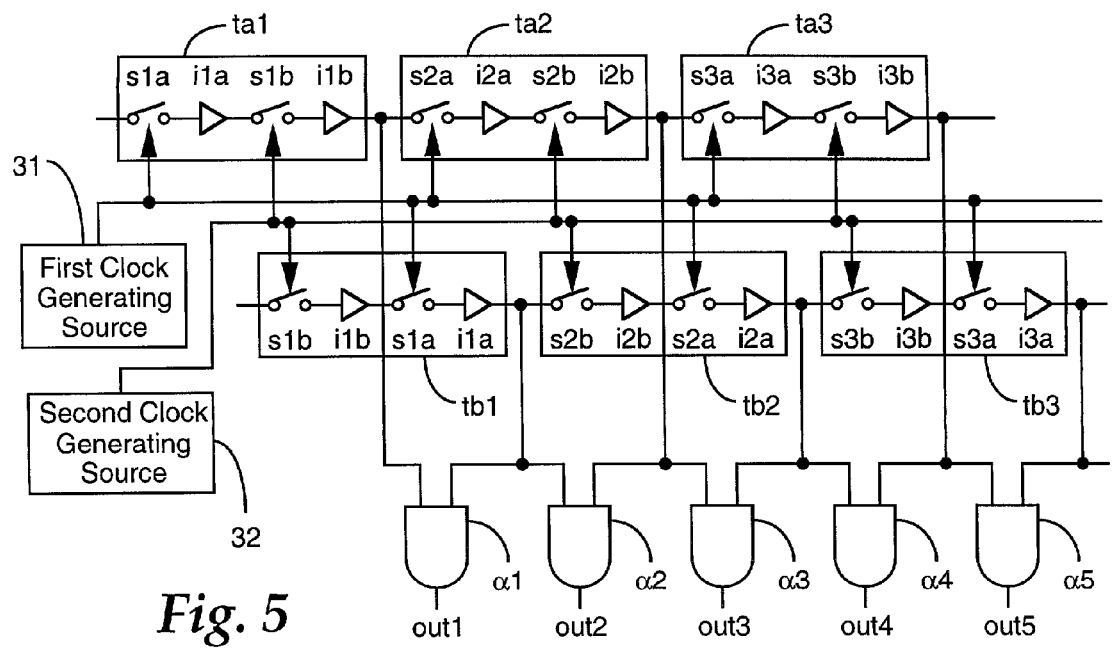
FIG. 5 is a schematic circuit diagram showing the internal structure of a scanning circuit of a third embodiment.
Figure 6:
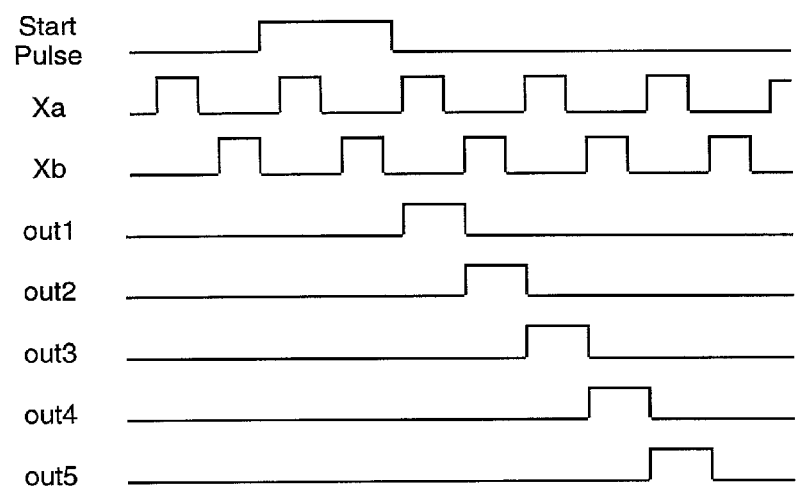
FIG. 6 is a timing chart showing the operation of the scanning circuit of the third embodiment.
Figure 10:
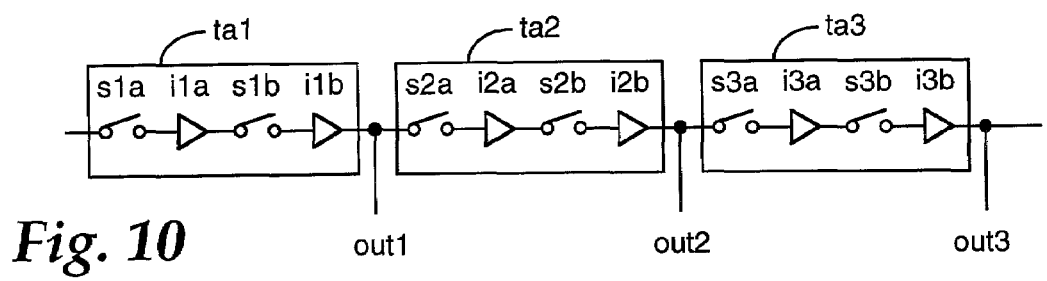
FIG. 10 is a schematic circuit diagram showing the internal structure of the conventional scanning circuit.
Figure 11:
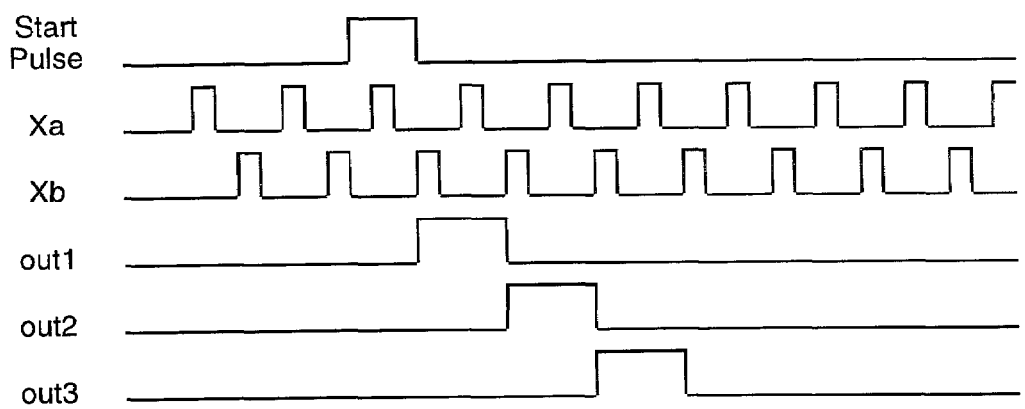
FIG. 11 is a timing chart showing the operation of the conventional scanning circuit.

A third embodiment of the present invention will be described with reference to the drawings. FIG. 5 is a schematic circuit diagram showing the internal structure of a scanning circuit of the present embodiment. FIG. 6 is a timing chart showing the operation of the scanning circuit of the present embodiment. In the scanning circuit of FIG. 5, the same parts as those of the scanning circuit of FIG. 10 are denoted by the same reference numbers, and detailed descriptions thereof are omitted.

The scanning circuit of FIG. 5 comprises: a number, m (m is an integer not less than 2), of transfer stages ta1 to tam connected in series; a number, m, of transfer stages tb1 to tbm connected in series; and a number, 2m−1, of AND circuits α1 to α(2m−1) supplied with signals output from the transfer stages ta1 to tam and signals output from the transfer stages tb1 to tbm (the first to the third stages are shown in FIG. 5). The transfer stages tak (k is a natural number where 1≦k≦m) each comprise switches ska and skb and inverters ika and ikb like the conventional transfer stages (FIG. 10).

Each transfer stage tbk comprises: a switch skb one end of which is supplied with the output from the transfer stage tb(k−1); an inverter ikb the input side of which is connected to the other end of the switch skb; a switch ska one end of which is connected to the output side of the inverter ikb; and an inverter ika the input side of which is connected to the other end of the switch ska.

The switches ska of the transfer stages are switched by a clock signal Xa generated by a first clock generating source 31. The switches skb of the transfer stages are switched by a clock signal Xb generated by a second clock generating source 32. Therefore, when the clock signal Xa is high, the switches s1a, s2a, s3a, . . . are on, and when the clock signal Xb is high, the switches s1b, s2b, s3b, . . . are on. The first clock generating source 31 and the second clock generating source 32 alternately generate clock pulses Xa and Xb as shown in FIG. 6.

When the transfer stages ta1 to tam and tb1 to tbm are structured as described above, the signals output from the transfer stage tak and the transfer stage tbk are input to the AND circuit α(2k−1), and the signals output from the transfer stage ta(k+1) and the transfer stage tbk are input to the AND circuit α2k. Then, the clock pulses Xa and Xb for alternately operating the switches s1a to sma and s1b to smb provided in the transfer stages ta1 to tam and tb1 to tbm, respectively, are alternately supplied.

At this time, in the transfer stages tak and tbk, when the clock signal Xa is high, the switch ska is on, and when the clock signal Xb is high, the switch skb is on. The outputs out1 to out(2m−1) of the AND circuits α1 to α(2m−1) are used as signals for scanning. The output of the transfer stage tak is the output of the inverter ikb provided in the transfer stage tak. The output of the transfer stage tbk is the output of the inverter ika provided in the transfer stage tbk.

In the scanning circuit structured as described above, a start pulse that is high from the generation of the clock pulse Xb to the second generation of the clock pulse Xa as shown in FIG. 6 is supplied to the first transfer stages ta1 and tb1. While the start pulse is high, first, the clock pulse Xa is supplied. At this time, the switches s1a to sma of the transfer stages ta1 to tam and tb1 to tbm are turned on. Consequently, in the transfer stage ta1, the start pulse which is high is supplied to the inverter i1a via the switch s1a, and a low-level signal is output from the inverter i1a.

Then, the clock pulse Xb is supplied next. At this time, the switches s1b to smb of the transfer stages ta1 to tam and tb1 to tbm are turned on. Consequently, in the transfer stage tb1, the start pulse which is high is supplied to the inverter i1b via the switch s1b and a low-level signal is output from the inverter i1b, and in the transfer stage ta1, the low-level signal output from the inverter i1a is supplied to the inverter i1b via the switch s1b and a high-level signal is output from the inverter i1b.

When the clock pulse Xa is supplied again after the start pulse becomes low, the switches s1a to sma of the transfer stages ta1 to tam and tb1 to tbm are turned on. Consequently, in the transfer stage tb1, the low-level signal output from the inverter i1b is supplied to the inverter i1a via the switch s1a and a high-level signal is output from the inverter i1a, and in the transfer stage ta2, the high-level signal output from the transfer stage ta1 is supplied to the inverter i2a via the switch s2a and a low-level signal is output from the inverter i2a.

At this time, in the transfer stage ta1, since a low-level signal is input, the input low-level signal is supplied to the inverter i1a via the switch s1a and a high-level signal is output from the inverter i1a, and since the switch s1b is off, the high-level signal output from the inverter i1b is held. Consequently, the high-level signals output from the transfer stages ta1 and tb1 are input to the AND circuit α1, the output out1 of the AND circuit α1 is high.

Then, when the clock pulse Xb is supplied again, the switches s1b to smb of the transfer stages ta1 to tam and tb1 to tbm are turned on. Consequently, in the transfer stage ta2, the low-level signal output from the inverter i2a is supplied to the inverter i2b via the switch s2b and a high-level signal is output from the inverter i2b, and in the transfer stage tb2, the high-level signal output from the transfer stage tb1 is supplied to the inverter i2b via the switch s2b and a low-level signal is output from the inverter i2b.

At this time, in the transfer stage ta1, a high-level signal is supplied from the inverter i1a to the inverter i1b via the switch s1b, and the signal output from the inverter i1b is low. In the transfer stage tb1, since a low-level signal is input, the input low-level signal is supplied to the inverter i1b via the switch s1b and a high-level signal is output from the inverter i1b, and since the switch s1a is off, the high-level signal output from the inverter i1a is held.

Consequently, since the signals output from the transfer stages ta1, tb1 and ta2 are low, high and high, respectively, the output out1 of the AND circuit α1 is low and the output out2 of the AND circuit α2 is high.

As described above, every time the clock pulse Xb is supplied, a high-level pulse signal is output from the transfer stages ta1 to tam in order of ta1, ta2, and tam, and every time the clock pulse Xa is supplied, a high-level pulse signal is output from the transfer stages tb1 to tbm in order of tb1, tb2, . . . and tbm. Consequently, every time the clock pulses Xa and Xb are alternately supplied, the outputs out1 to out(2m−1) are output from the AND circuits α1 to α(2m−1) in order of out1, out2, out3, . . . and out(2m−1) as pulse signals for scanning.

By doing this, the pulse width of the clock pulses Xa and Xb externally input to the scanning circuit can be less than the full length of the pulse width of the output outk and can be twice that in the prior art. Consequently, pulse signals for high-speed scanning can be output from the scanning circuit with clocks having a lower frequency than those in the prior art. While the number of transfer stages tam and the number of transfer stages tbm are the same in this embodiment, the present invention is not limited thereto. The number of transfer stages tbm may be reduced by one. When this is done, the number of outputs is reduced by one and the number of AND circuits is 2(m−1).

Fourth Embodiment

Figure 7:
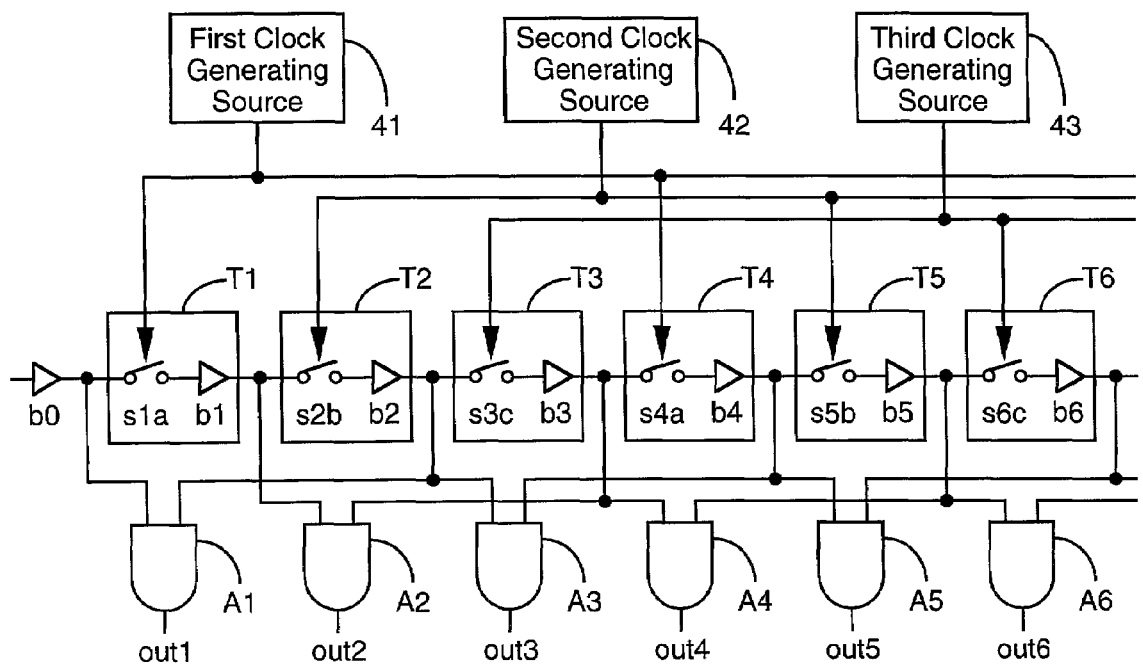
FIG. 7 is a schematic circuit diagram showing the internal structure of a scanning circuit of a fourth embodiment.
Figure 8:
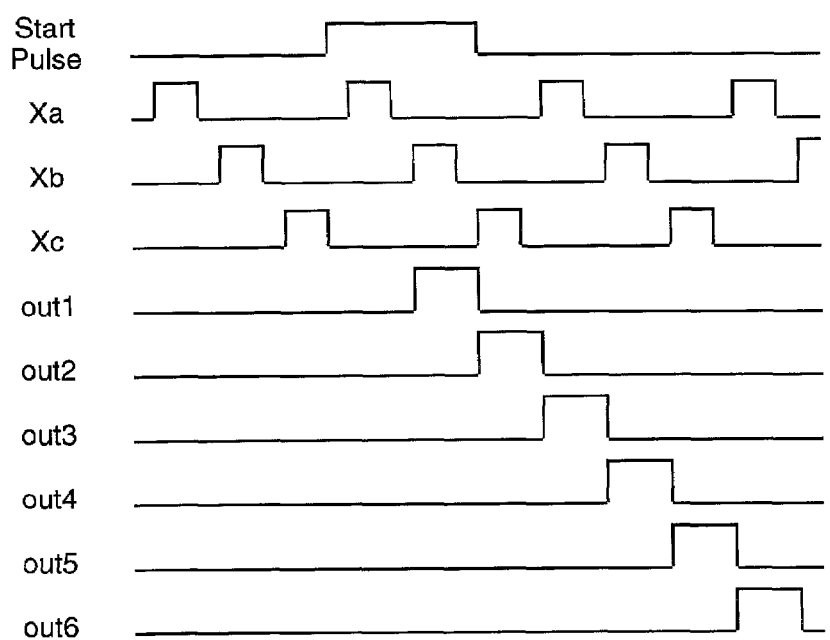
FIG. 8 is a timing chart showing the operation of the scanning circuit of the fourth embodiment.

A fourth embodiment of the present invention will be described with reference to the drawings. FIG. 7 is a schematic circuit diagram showing the internal structure of a scanning circuit of the present embodiment. FIG. 8 is a timing chart showing the operation of the scanning circuit of the present embodiment. In the scanning circuit of FIG. 7, the same parts as those of the scanning circuit of FIG. 1 are denoted by the same reference numbers, and detailed descriptions thereof are omitted.

In the first embodiment, the switches included in the transfer stages are divided into two groups, that is, ska and skb. On the contrary, in the present embodiment, the switches are divided into three groups, that is, ska, skb and skc. Moreover, while two kinds of pulse generating sources are provided in the first embodiment, three kinds are provided in the present embodiment.

With this, while an output of a period half the period of the pulses generated by the pulse generating sources 11 and 12 is obtained in the first embodiment, an output of a period one-third the period of the pulses generated by pulse generating sources 41, 42 and 43 is obtained in the present embodiment.

The scanning circuit of FIG. 7 comprises: a buffer b0 the input side of which is supplied with a start pulse; a number, n (n is an integer not less than 2), of transfer stages T1 to Tn connected in series; and a number, n, of AND circuits A1 to An supplied with signals output from the transfer stages T1 to Tn. Each transfer stage Tk comprises a switch skx and a buffer bk like the first embodiment (FIG. 1) (the first to the sixth stages are shown in FIG. 7). That is, the k-th (k is an integer where 1≦k≦n) transfer stage Tk comprises: the switch skx (x represents one of a, b and c) one end of which is supplied with the output from the transfer stage T(k−1); and the buffer bk the input side of which is connected to the other end of the switch skx. One end of the switch skx and the output side of the buffer b(k+1) are connected to the input side of the AND circuit Ak. The output outk of the AND circuit Ak is used as a signal for scanning.

The switches s(3m−2)a provided in the (3m−2)-th ones of the transfer stages T1 to Tn are switched by a clock signal Xa generated by the first clock generating source 41, where m is an integer and 1≦m≦n/3. The switches s(3m−1)b provided in the (3m−1)-th ones of the transfer stages T1 to Tn are switched by a clock signal Xb generated by the second clock generating source 42. The switches s3mc provided in the 3m-th ones of the transfer stages T1 to Tn are switched by a clock signal Xc generated by the third clock generating source 43. Consequently, when the clock signal Xa is high, the switches s1a, s4a, s7a, . . . of the transfer stages T1, T4, T7, . . . are on, when the clock signal Xb is high, the switches s2b, s5b, s8b, . . . of the transfer stages T2, T5, T8, . . . are on, and when the clock signal Xc is high, the switches s3c, s6c, s9c, . . . of the transfer stages T3, T6, T9, . . . are on.

In the scanning circuit structured as described above, the start pulse that is high while the clock signal Xc is low as shown in FIG. 8 is supplied to the first transfer stage T1 via the buffer b0. Then, when the clock pulse Xa is supplied while the start pulse is high, the switches s1a, s4a, s7a, of the (3m−2)-th transfer stages T1, T4, T7, are turned on. Consequently, since the state is such that a high-level signal is input only to the buffer b1 of the transfer stage T1 supplied with the start pulse via the buffer b0, a high-level signal is output via the switch s1a and the buffer b1 of the transfer stage T1.

At this time, the signal input to the transfer stage T1 is high and the signal output from the transfer stage T1 is high. However, the signal output from the transfer stage T2 is low, so that the output out1 from the AND circuit A1 is low. Then, the switches s1a, s3a, s5a, . . . are turned off. When the clock pulse Xb is supplied, the switches s2b, s5b, s8b, . . . of the (3m−1)-th transfer stages T2, T5, T8, . . . are turned on. Consequently, since the current state is such that a high-level signal is supplied only to the buffer b2 of the transfer stage T2 connected to the transfer stage T1, a high-level signal is output via the switch s2b and the buffer b2 of the transfer stage T2. At this time, since the start signal input to the transfer stage T1 is high and the signal output from the transfer stage T2 is high, the two inputs to the AND circuit A1 are high, so that the output out1 from the AND circuit A1 is high.

Then, when the clock pulse Xc is supplied again after the switches s2b, s4b, s6b, . . . are turned off, the switches s3c, s6c, s9c, . . . of the 3m-th transfer stages T3, T6, T9, . . . are turned on, so that a low-level signal is input to the 3m-th transfer stages other than the transfer stage T3, which is supplied with a high-level signal from the transfer stage T2. At this time, the start pulse goes low, so that the low-level signal output via the buffer b0 is input to the AND circuit A1, and the output out1 goes low.

At the same time, the outputs of the stages T1 and T3 are both high. Since these two output signals form the inputs to the AND circuit A2, the output out2 goes high.

Then, when the clock pulse Xa is supplied again after the switches s3c, s6c, s9c, . . . are turned off, the switches s1a, s4a, s7a, . . . of the (3m−2)-th transfer stages T1, T4, T7, . . . are turned on. The current state is such that a high-level signal is supplied to the buffer b4 of the transfer stage T4 connected to the transfer stage T3, a high-level signal is output via the switch s4a and the buffer b4 of the transfer stage T4. At this time, since the signal input to the transfer stage T3 is high and the signal output from the transfer stage T3 is high, the two inputs to the AND circuit A3 are high, so that the output out3 from the AND circuit A3 is high.

At the same time, when the clock pulse Xa is supplied again after the switches s3c, s6c, s9c, . . . are turned off, the switches s1a, s4a, s7a, . . . of the (3m−2)-th transfer stages T1, T4, T7, . . . are turned on, so that a low-level signal is input to the (3m−2)-th transfer stages other than the transfer stage T4, which is supplied with a high-level signal from the transfer stage T3. At this time, the low-level signal output via the switch s1a and the buffer b1 of the transfer stage T1 is output to the AND circuit A2, so that the output out2 is low.

Then, when the clock pulse Xb is supplied again after the switches s1a, s3a, s5a, . . . are turned off, the transfer stage T5 performs an operation similar to that performed by the transfer stage T2 when the clock pulse Xb is supplied and the output out1 is output, so that the signal input to the transfer stage T4 is high and the signal output from the transfer stage T5 is high. Consequently, the output out4 from the AND circuit A4 is high.

By alternately supplying the clock pulses Xa, Xb and Xc to thereby alternately drive the (3m−2)-th transfer stages T1, T4, T7, . . . , the (3m−1)-th transfer stages T2, T5, T8, . . . and the 3m-th transfer stages T3, T6, T9, . . . as described above, the outputs out1 to outn can be output from the AND circuits A1 to An in order of out1, out2, out3, . . . and outn as pulse signals for scanning.

By doing this, the pulse width of the clock pulses Xa, Xb and Xc externally input to the scanning circuit can be less than the full length of the pulse width of the output outk. That is, pulse signal outputs for scanning can be obtained at intervals shorter than the intervals at which the clock generating sources generate the clocks. Specifically, in the present embodiment, the pulse width can be three times that in the prior art. Consequently, pulse signals for high-speed scanning can be output from the scanning circuit with clocks having a lower frequency than those in the prior art.

<EXEMPLARY IMPLEMENTATION>

Figure 9:
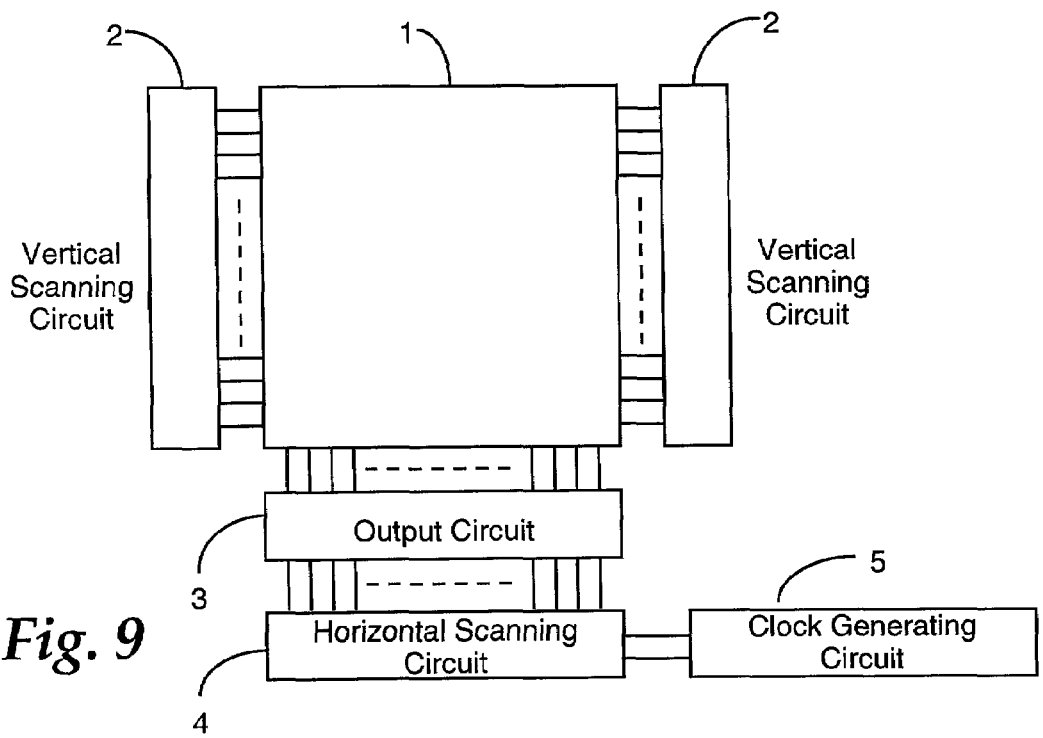
FIG. 9 is a block diagram showing the internal structure of an imaging apparatus having the scanning circuit of the present invention.

An imaging apparatus to which any one of the scanning circuits of the first to the fourth embodiments is applied will be described with reference to FIG. 9. FIG. 9 is a block diagram showing the internal structure of the imaging apparatus according to any one of the first to the fourth embodiments.

The imaging apparatus of FIG. 9 comprises: a solid-state image sensing device 1 having a plurality of pixels arranged in a matrix; a vertical scanning circuit 2 for selecting pixels of the solid-state image sensing device 1 in units of rows; a horizontal scanning circuit 3 for selecting pixels of the solid-state image sensing device 1 in units of columns; an output circuit 4 that amplifies and outputs the values from the pixels of the solid-state image sensing device 1; and a clock generating circuit 5 that supplies clocks to switches in the horizontal scanning circuit 3. The clock generating circuit 5 has a plurality of clock generating sources, and the number of clock generating sources varies between two and three according to which of the structures of the first to the fourth embodiments the horizontal scanning circuit 3 is provided with.

In the imaging apparatus structured as described above, the vertical scanning circuit 2 drives pixels of the solid-state image sensing device 1 by biasing them in units of rows so that pixels, in a row, of the solid-state image sensing device 1 are switched every vertical scanning period. Then, the horizontal scanning circuit 3 successively drives an output switch provided in the output circuit 4 for each column of pixels of the solid-state image sensing device 1 within one vertical scanning period, whereby the outputs of the pixels in one row driven by the vertical scanning circuit 2 are amplified and output one by one by the output circuit 4. That is, when there are a number, x, of pixels in one row in the solid-state image sensing device 1, a number, x, of pulses are output from the horizontal scanning circuit 3 while one pulse is output from the vertical scanning circuit 2. In a case where a matrix is scanned in units of rows as described above, successively sampling elements included in a row is referred to as main scanning, and shifting the row to be scanned is referred to as sub scanning. In this imaging apparatus, the horizontal scanning is the main scanning, and the vertical scanning is the sub scanning.

As described above, it is necessary that the horizontal scanning circuit 3 be driven at a higher speed than the vertical scanning circuit 2. Therefore, by using any one of the scanning circuits of the first to the fourth embodiments as the horizontal scanning circuit 3, the horizontal scanning circuit 3 can be driven at a high speed even when the frequency of the externally input clock signals is low.

By doing this, the pulse width of the clock signals externally input to the scanning circuit can be less than the full length of the pulse width of the pulse signals for scanning and can be twice that in the prior art. Consequently, pulse signals for scanning can be output from the scanning circuit with clock signals having a lower frequency than those in the prior art. For this reason, the scanning circuit is suitable for high-speed driving. Moreover, by adjusting the pulse width of the first and the second pulses, the pulse width of the pulse signals for scanning can be set, so that the pulse signals are reliable.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A scanning circuit, comprising:
   a plurality of transfer stages connected in series, each of which receives an input signal and produces a corresponding output signal, wherein each transfer stage comprises only one switch that receives the input signal and is activated by a clock signal, and only one buffer for receiving and holding the input signal when said switch is closed;
   an output circuit which comprises a sequence of AND gates and performs a logical AND function of the output signals of said transfer stages and another signal to generate scanning pulses; and
   a clock generating circuit that supplies clock signals to said transfer stages in an alternating manner to generate a progressive sequence of scanning pulses.

2. The scanning circuit of claim 1, wherein said output circuit logically combines the output signal of a given transfer stage with the input signal to said stage.

3. The scanning circuit of claim 2, wherein said transfer stages are divided into two groups, one of which comprises odd-numbered stages of said series and the other of which comprises even-numbered stages of said series, and wherein said clock generating circuit supplies clock pulses to said two groups in an alternating manner.

4. The scanning circuit of claim 1, wherein said transfer stages are divided into two groups, one of which comprises odd-numbered stages of said series and the other of which comprises even-numbered stages of said series, and wherein said clock generating circuit supplies clock pulses to said two groups in an alternating manner.

5. A scanning circuit, comprising:
   a plurality of transfer stages connected in series, each of which includes a switch that receives an input signal, and that produces an output signal having a state related to said input signal, wherein each transfer stage comprises only one switch that receives the input signal and is activated by a clock signal, and only one buffer for receiving and holding the input signal when said switch is closed;
   a clock generating circuit that generates a first clock signal at a given frequency having a first phase that is applied to the switches in a first group of said transfer stages, to cause said transfer stages to receive an input signal at a time corresponding to said first phase, and a second clock signal at said given frequency having a second phase different from said first phase, that is applied to the switches in a second group of said transfer stages, to cause said transfer stages in said second group to receive an input signal at a time corresponding to said second phase; and
   an output circuit comprising a sequence of AND gates, each of which receives an output signal from a transfer stage in said first group and a transfer stage in said second group, to produce a sequence of scanning pulses at a frequency higher than said given frequency.

6. The scanning circuit of claim 5, wherein the transfer stages of said first group and the transfer stages of the second group are connected in series in an alternating manner, such that the output signal of a transfer stage in one group is the input signal of a transfer stage in the other group.

7. The scanning circuit of claim 5, wherein the transfer stages of said first group are connected to one another in a first series such that the output signal of one transfer stage in said first group is the input signal of another transfer stage in said first group, and the transfer stages of said second group are connected to one another in a second series such that the output signal of one transfer stage in said second group in the input signal to another transfer stage in said second group.

8. The scanning circuit of claim 7, wherein each AND circuit at the 2m−1 ordinal position in said sequence, where m=1, 2, 3 . . . , is connected to the m-th transfer stage in said first group and the m-th transfer stage in said second group, and each AND circuit at the 2m ordinal position in said sequence is connected to the (m+1)-th transfer stage in said first group and the m-th transfer stage in said second group.

9. The scanning circuit of claim 5, which generates a progressive sequence of scanning pulses.

10. An imaging apparatus, comprising:
    an image sensing device having an array of pixels;
    an output circuit for outputting values from selected pixels in said array;
    a scanning circuit for selecting the pixels in said array, including a plurality of transfer stages connected in series, each of which receives an input signal and produces a corresponding output signal, and an output circuit which comprises a sequence of AND gates and performs a logical AND function of the output signals of said transfer stages and another signal to generate scanning pulses, wherein each transfer stage comprises only one switch that receives the input signal and is activated by a clock signal, and only one buffer for receiving and holding the input signal when said switch is closed; and
    a clock generating circuit that supplies clock signals to said transfer stages in an alternating manner to generate a progressive sequence of scanning pulses.

11. The imaging apparatus of claim 10, wherein said scanning circuit is a horizontal scanning circuit.

12. The imaging apparatus of claim 10, wherein said each scanning pulse is provided to each electrode connecting each pixel.

13. A pulse signal generating apparatus comprising:
    a transfer stage portion comprising a plurality of transfer stages connected in series, said transfer stages each including only one switch for passing current in a direction in which the transfer stages are connected in series, and only one buffer for receiving and holding the input signal when said switch is closed;
    a first pulse generating portion that supplies a first driving pulse to first switches in the transfer stage portion at predetermined intervals;
    a second pulse generating portion that supplies a second driving pulse whose phase is shifted from that of the first driving pulse, at the predetermined intervals, to second switches of the transfer stages which switches are not included in the first switches; and
    an output portion that outputs pulse signals successively from a plurality of AND gates connected to the transfer stages, at intervals shorter than the predetermined intervals.

14. The pulse signal generating apparatus of claim 13 wherein:
    the gates comprise first gates capable of outputting pulse signals by being supplied with the first driving pulse, and second gates capable of outputting pulse signals by being supplied with the second driving pulse; and
    a pulse signal for scanning is output alternatively from a gate included in the first gates and a gate included in the second gates.

15. The scanning circuit of claim 13, which generates a progressive sequence of scanning pulses.

* * * * *